(12) United States Patent
Wang et al.

(10) Patent No.: US 9,041,571 B2
(45) Date of Patent: May 26, 2015

(54) FLEXIBLE ADC CALIBRATION TECHNIQUE USING ADC CAPTURE MEMORY

(71) Applicant: Broadcom Corporation, Irvine, CA (US)

(72) Inventors: John Wang, Sunnyvale, CA (US); Vasudevan Parthasarathy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/020,529

(22) Filed: Sep. 6, 2013

(65) Prior Publication Data

US 2015/0070198 A1    Mar. 12, 2015

(51) Int. Cl.
*H03M 1/10*  (2006.01)
*H03M 1/12*  (2006.01)

(52) U.S. Cl.
CPC .............. *H03M 1/1009* (2013.01); *H03M 1/12* (2013.01); *H03M 1/121* (2013.01); *H03M 1/1205* (2013.01)

(58) Field of Classification Search
CPC ......... H03M 1/00; H03M 1/001; H03M 1/06; H03M 1/12; H03M 1/1205; H03M 1/121; H03M 1/1215; H03M 1/1019; H03M 1/1038; H03M 1/1042; H03M 1/1052

USPC ........................................... 341/118, 155, 120
See application file for complete search history.

(56) References Cited

U.S. PATENT DOCUMENTS

| | | | | |
|---|---|---|---|---|
| 7,161,514 B2 * | 1/2007 | Tamba | ........................ | 341/120 |
| 7,183,953 B2 * | 2/2007 | Kadota | ........................ | 341/120 |
| 7,808,408 B2 * | 10/2010 | Madisetti et al. | ............ | 341/118 |
| 7,839,323 B2 * | 11/2010 | Kidambi | ...................... | 342/118 |
| 8,643,517 B2 * | 2/2014 | Kidambi | ...................... | 341/118 |

* cited by examiner

*Primary Examiner* — Khai M Nguyen
(74) *Attorney, Agent, or Firm* — Sterne, Kessler, Goldstein & Fox PLLC

(57) ABSTRACT

Systems and methods are provided for calibrating an analog to digital converter (ADC) using one or more feedback mechanisms. In an embodiment, a capture memory module captures a portion of ADC data and post-processes the captured data using a microprocessor to perform calibration. Using the microprocessor, the capture memory module calibrates the ADC until the output of the ADC is within a desired range. In an embodiment, the capture memory module also captures a portion of data output from a digital correction module and post-processes this captured data using the microprocessor. Using the microprocessor, the capture memory module calibrates the digital correction module until the output of the digital correction module is within a desired range.

20 Claims, 9 Drawing Sheets

FLEXIBLE ADC CALIBRATION TECHNIQUE USING ADC CAPTURE MEMORY

FIELD OF THE INVENTION

This invention relates to analog to digital converters and more specifically to analog to digital converter calibration.

BACKGROUND

Analog to digital converters (ADCs) are used to convert a continuous analog signal to a discrete digital signal. For example, an ADC can convert an analog voltage signal to a digital signal based on samples of the voltage of the analog signal. These samples represent the amplitude of the voltage of the analog signal at different times.

Because of physical limitations, ADCs do not operate perfectly. Thus, the output of an ADC deviates from an ideal value. For example, an ADC can introduce noise into the digital signal it produces. For example, jitter in an ADC can be caused by small timing errors made during sampling of the analog signal. A signal-to-noise (SNR) ratio of the ADC can characterize the amount of noise introduced. An ADC can also be bandwidth limited (i.e., it may only support a specific range of frequencies).

ADCs can be calibrated to evaluate and enhance their effectiveness. For example, the output of an ADC can be tested and evaluated to determine how much this output deviates from an ideal value that would normally be produced if the ADC operated perfectly without introducing any additional noise or error. The ADC can then be adjusted to mitigate the error introduced by the ADC.

Different calibration techniques can be used to evaluate the effectiveness of an ADC. However, each of these techniques has limitations. For example, blind calibration of timing and gain mismatches of ADCs relies on the use of signal statistics such as power spectra, correlation between lanes, etc. One problem with a blind calibration approach is that no single metric works for all possible applications. Calibration approaches that assume that the input signal is band-limited can work well when raised cosine transmission filtering is present but can fail for implementations that do not have this filtering. Correlation schemes work well when the input is sampled at the baud rate but fail for oversampled ADC applications. Further, these typical calibration implementations rely on dedicated hardware (i.e. correlators and filters) to perform ADC calibration.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1A:
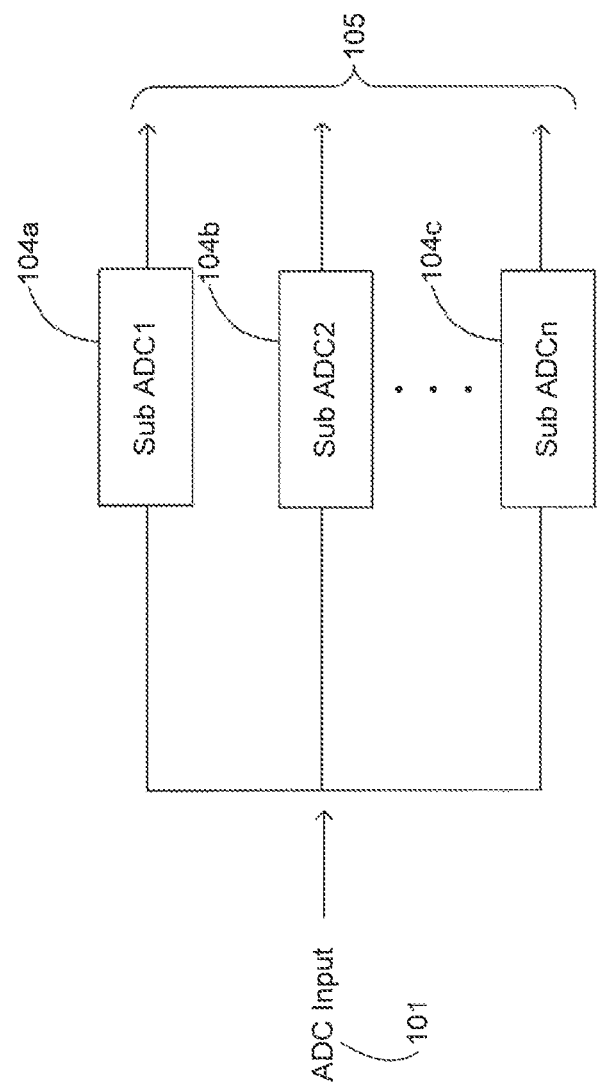
FIG. 1A is a block diagram of an interleaved ADC that can be used in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Embodiments of the present disclosure provide improved analog to digital converter (ADC) calibration techniques using one or more feedback mechanisms. In an embodiment, a capture memory module captures a portion of ADC data and post-processes the captured data using a microprocessor to perform calibration. Systems and methods provided by embodiments of the present disclosure advantageously allow for the implementation of multiple error metrics that can be dynamically selected based on observed input statistics.

1.1 Interleaved ADC

As discussed above, an ADC can be bandwidth limited (i.e., it may only support a specific range of frequencies). To increase sampling bandwidth, two or more ADCs can be interleaved to simultaneously sample an input signal. These interleaved ADCs can produce an output signal with a sampling bandwidth that is higher than the sampling bandwidth of any individual ADC. Thus, ADCs can be interleaved with each other to produce an interleaved ADC with an higher sampling bandwidth. The individual ADCs in the interleaved ADC can be referred to as sub-modules of the larger interleaved ADC.

FIG. 1A is a block diagram of an interleaved ADC 100a that can be used in accordance with an embodiment of the present disclosure. Interleaved ADC 100a includes a plurality of sub-modules "Sub ADC" 104. In an embodiment, Sub ADC modules 104 are arranged in parallel. In FIG. 1, signal 101 is input to multiple ADC sub-modules "Sub ADC1"-"Sub ADCn" 104 to produce an output signal 105 with a sampling bandwidth that is higher than the sampling bandwidth of any individual sub-module 104. As the number of sub-modules 104 of interleaved ADC 100a increases, the effective sampling rate of interleaved ADC 100a increases.

Specifically, adding "n" sub-modules to interleaved ADC 100a increases the effective sampling rate of interleaved ADC 100a by a factor of n.

In an embodiment each submodule 104a, 104b, and 104c has the same sampling rate. For example, if interleaved ADC 100a has 3 sub-modules 104, and each sub-module 104a, 104b, and 104c has a sampling rate of "$f_s$," the effective sampling rate of interleaved ADC 100a is $3f_s$. However, it should be understood that, in an embodiment of the present disclosure, submodules 104a, 104b, and 104c can have different sampling rates.

1.2 Time-Interleaved ADC

Figure 1B:
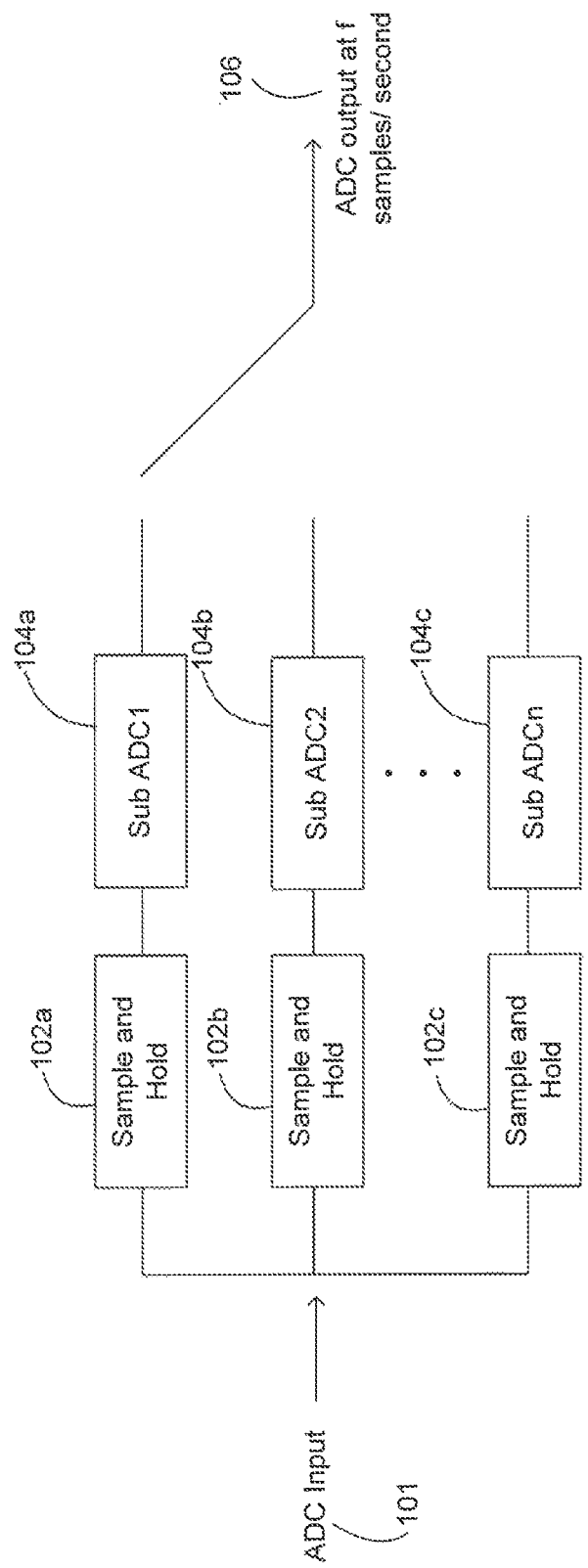
FIG. 1B is a block diagram of a time-interleaved ADC with an interleave factor of "n" that can be used in accordance with an embodiment of the present disclosure.

ADC sub-modules can be interleaved in a number of ways. For example, sub-modules of an interleaved ADC can be time-interleaved so that each sub-module samples ADC input signal 101 at a different time. FIG. 1B is a block diagram of a time-interleaved ADC 100b with an interleave factor of "n" that can be used in accordance with an embodiment of the present disclosure. Time-interleaved ADC 100b includes one or more sub modules 104 and one or more sample-and-hold modules 102. In an embodiment, each output of sample and hold modules 102a, 102b, and 102c is connected to a respective sub-module 104a, 104b, or 104c that converts the received analog signal to a digital signal. In an alternative embodiment, a subset of sub-modules 104 has an associated sample-and-hold module 102. In a further alternative embodiment, a single sample-and-hold module 102 is coupled to multiple submodules 104.

In FIG. 1B, sample-and-hold modules 102 sample ADC input signal 101 (e.g., in a round robin fashion) and store a value representative of the sample (e.g., a number representing the amplitude of the sampled signal). Sample-and-hold modules 102 output the representative sample value to respective sub-modules 104. The number of sample-and-hold modules 102 and sub-modules 104 increases with the interleave factor of time-interleaved ADC 100b.

In an embodiment, sample-and-hold modules 102 are triggered in a round robin fashion so that sample-and-hold module 102a, 102b, or 102c are updated at a rate of 1/n times the sampling rate of time-interleaved ADC 100b. The outputs of sub-modules 104 are multiplexed back together to produce a digital output signal 106 that is sampled at the desired output rate.

Ideally, the gain and offset of the analog path from ADC input signal 101 to each of sub-modules 104 is identical. Similarly, the time interval between respective samplings performed by each sample-and-hold module 102 should ideally be identical. In real implementations, however, these values cannot be assumed to be identical due to hardware limitations and other factors. These deficiencies can degrade ADC performance. A system can compensate for these deficiencies by, for example, providing analog adjustments within time-interleaved ADC 100b or by performing digital computations using the output of time-interleaved ADC 100b.

1.3 Calibrated ADC

ADCs can be calibrated to compensate for deficiencies that arise due to hardware limitations and physical imperfections. One challenge that can arise with ADC calibration is accurately estimating the gain, offset, or timing-skew correction to be applied to properly calibrate the ADC. Some calibration techniques involve directly measuring ADC deficiencies (e.g., by using a training signal). In blind ADC calibration, for example, ADC imperfections are not measured directly. Instead, assumptions about the input signal are made. These assumptions can include, for example: (1) that the input signal is sampled in a manner such that a known frequency band contains no signal energy; (2) that the input signal is a digital communications signal that has been degraded in a known manner; and (3) that the spectral characteristics of the input signal are known. These assumptions can be used to dictate one or more techniques for calibrating the ADC, including gain, offset, and/or timing correction. If the assumptions are violated, then the calibration is likely to be ineffective and/or fail.

Figure 2:
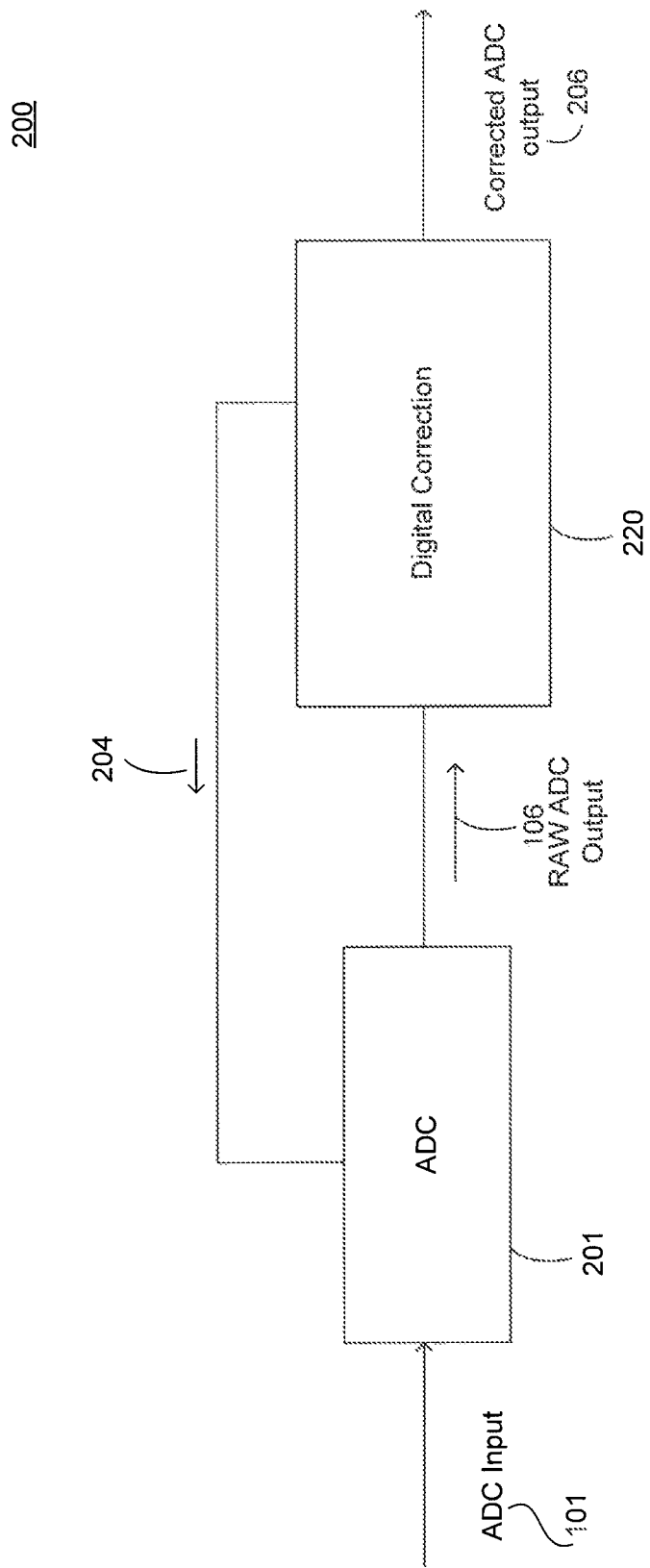
FIG. 2 is a block diagram of a system for calibrating an ADC using a digital correction module in accordance with an embodiment of the present disclosure.

FIG. 2 is a block diagram of a system 200 for calibrating an ADC using a digital correction module 220 in accordance with an embodiment of the present disclosure. In an embodiment, system 200 includes ADC 201 and digital correction module 220. System 200 can be implemented using hardware, software, or a combination of hardware and software. In an embodiment, system 200 is implemented on a single chip.

In an embodiment, ADC 201 is time-interleaved (e.g., such as time-interleaved ADC 100b). However, it should be understood that other ADCs, such as interleaved ADC 100a, can also be used in the embodiment shown in FIG. 2. In FIG. 2, digital output signal 106 of ADC 201 is input into digital correction module 220. In an embodiment, digital correction module 220 uses one or more algorithms and/or hardware logic circuitry to determine gain, offset, and/or timing correction parameters. These parameters can be digital or analog parameters, and digital correction module 220 can be implemented using digital or analog hardware.

In an embodiment, digital correction module 220 can digitally correct digital output signal 106 and output a corrected ADC output signal 206 without initiating any adjustment to ADC 201. Alternatively, digital correction module 220 can use the determined gain, offset, and/or timing correction parameters to adjust ADC 201. For example, based on these determined parameters, digital correction module 220 can generate a correction signal 204 and can transmit correction signal 204 to ADC 201 via a feedback path.

ADC 201 receives correction signal 204 and initiates a reconfiguration of one or more parameters of ADC 201 based on correction signal 204 to calibrate ADC 201. Based on this calibration, digital output signal 106 changes. In an embodiment, digital correction module 220 detects this change and then determines (e.g., based on one or more algorithms and/or hardware logic circuitry) whether to initiate additional calibration of ADC 201 via the feedback path. For example, in an embodiment, based on determined gain, offset, and/or timing correction parameters, digital correction module 220 can determine that digital output signal 106 is within a predefined range of a desired value and can then determine that no additional calibration of ADC 201 should be performed. Once digital correction module 220 determines that output of ADC 201 has been sufficiently calibrated, digital correction module 220 outputs the corrected ADC output signal 206. In an embodiment, digital correction module 220 outputs corrected ADC output signal 206 continuously, even while ADC calibration is still being performed.

1.4 ADC Calibration Using Capture Memory

Figure 3:
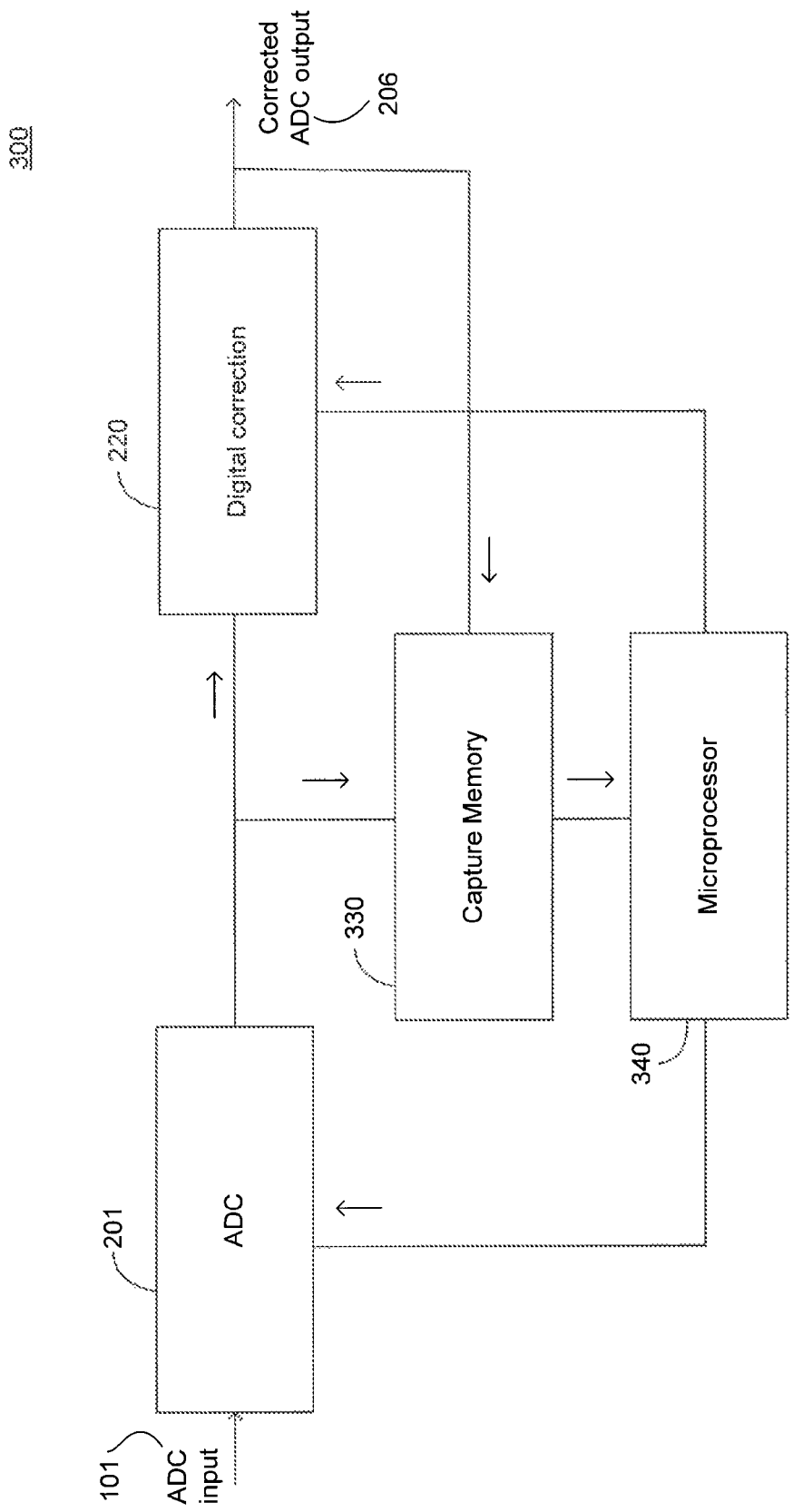
FIG. 3 is a block diagram of a system for calibrating an ADC using an ADC capture memory module in accordance with an embodiment of the present disclosure.

FIG. 3 is a block diagram of a system 300 for calibrating an ADC using an ADC capture memory module in accordance with an embodiment of the present disclosure. In an embodiment, system 300 includes ADC 201, digital correction module 220, capture memory module 330, and microprocessor 340. System 300 can be implemented using hardware, software, or a combination of hardware and software. In an embodiment, system 300 is implemented on a single chip.

In an embodiment, ADC 201 is time-interleaved (e.g., such as time-interleaved ADC 100b). However, it should be understood that other ADCs, such as interleaved ADC 100a, can also be used in the embodiment shown in FIG. 3 in accordance with embodiments of the present disclosure. Microprocessor 340 can be an on-chip or off-chip microprocessor. Further, it should be understood that microprocessor 340 can be any processor in accordance with embodiments of the present disclosure. For example, in an embodiment, microprocessor 340 can be implemented external to the chip implementing the other modules of system 300 (e.g., as a field-programmable gate array (FPGA)).

As discussed above, digital correction module 220 determines gain, offset, and/or timing correction parameters. Digital correction module 220 outputs corrected ADC output signal 206. In an embodiment, corrected ADC output signal 206 is input to capture memory module 330. Capture memory module 330 may also receive the output of ADC 201 (e.g., digital output signal 106). While FIG. 3 shows capture memory module 330 receiving outputs from both ADC 201 and digital correction module 220, it should be understood that, in an embodiment, capture memory module can be coupled to either ADC 201 only or digital correction module 220 only.

Capture memory module 330 captures all or a portion of ADC data and/or digitally corrected ADC data and processes the data using microprocessor 340. Based on this capture data, capture memory module 330 can determine gain, offset, and/or timing correction parameters. Capture memory module 330 uses microprocessor 340 to set the parameters used by analog or digital correction hardware by sending signals to ADC 201 and/or digital correction module 220. Capture memory module 220 can set the parameters of only ADC 201, only digital correction module 220, or both ADC 201 and digital correction module 220.

In an embodiment, capture memory module 330 uses microprocessor 340 to look at the characteristics of the received signal and determine which calibration scheme (of several possible calibration schemes) is appropriate to achieve the best calibration results. Capture memory module 330 then instructs configures ADC 201 and/or digital correction module 220 based on the appropriate calibration scheme.

For example, these schemes include schemes for band-limited schemes or schemes assuming that cross-correlation between individual ADCs should be equal. Using microprocessor 340, capture memory module 330 can measure the bit error rate in data received from ADC 201 and/or digital correction module 220 and can determine the effect that changing parameters has on the bit error rate. Additionally, using microprocessor 340, capture memory module 330 provides the ability to correct for bandwidth mismatch and/or non-linearities among sub-modules 104.

As discussed above, capture memory module 330 can use microprocessor 340 to configure either or both of ADC 201 or digital correction module 220. After configuring either (or both of) ADC 201 or digital correction module 220, capture memory 330 can examine the new output of ADC 201 or digital correction module 220 and can determine whether additional configuration is necessary. ADC 201 or digital correction module 220 can be reconfigured until capture memory module 330 determines that the output of ADC 201 or digital correction module 220 is within a predefined range of a desired value.

In embodiments, capture memory module 330 calibrates ADC 201. For example, in an embodiment, capture memory module 330 can generate an analog signal based on the determined parameters and can transmit the analog signal to ADC 201. It should be understood that, in an embodiment, capture memory module 330 can generate a digital signal instead of, or in addition to, an analog signal.

In an embodiment, the signal generated by capture memory module 330 initiates a reconfiguration of software or hardware of ADC 201 to calibrate ADC 201. In an embodiment, ADC 201 generates a new output signal (e.g., digital output signal 106) after being calibrated by capture memory module 330, and capture memory module 330 captures a portion of this new output signal. Based on this new captured data, capture memory module 330 can determine whether to perform additional calibration of ADC 201. If capture memory module 330 determines that additional calibration of ADC 201 should be performed, capture memory module 330 transmits another analog signal to ADC 201 to perform further calibration. This process can repeat until capture memory module 330 determines that no additional calibration of ADC 201 should be performed. For example, in an embodiment, based on determined gain, offset, and/or timing correction parameters, capture memory module 330 can determine that the output of ADC 201 is within a predefined range of a desired value and can then determine that no additional calibration of ADC 201 should be performed.

Alternatively, capture memory module 330 may calibrate digital correction module 220. For example, in an embodiment, capture memory module 330 can generate a digital signal based on the determined parameters and can transmit the digital signal to digital correction module 220. This signal can initiate a reconfiguration of software or hardware of digital correction module 220 to calibrate digital correction module 220. In an embodiment, digital correction module 220 generates a new output signal (e.g., corrected ADC output signal 206) after being calibrated by capture memory module 330, and capture memory module 330 captures a portion of this new output signal. Based on this new captured data, capture memory module 330 can determine whether to perform additional calibration of digital correction module 220. If capture memory module 330 determines that additional calibration of digital correction module 220 should be performed, capture memory module 330 transmits another digital signal to digital correction module 220 to perform further calibration. This process can repeat until capture memory module 330 determines that no additional calibration of digital correction module 220 should be performed. For example, in an embodiment, based on determined gain, offset, and/or timing correction parameters, capture memory module 330 can determine that the output of digital correction module 220 is within a predefined range of a desired value and can then determine that no additional calibration of digital correction module 220 should be performed.

In a further embodiment, capture memory module 330 can initiate calibration to both ADC 201 and digital correction module 220. For example, capture memory module 330 can generate an analog signal and a digital signal based on the determined parameters. Capture memory module 330 transmits the analog signal to ADC 201 and transmits the digital signal to digital correction module 220. This signal can initiate a reconfiguration of software or hardware of ADC 201 to calibrate ADC 201 and digital correction module 220. In an embodiment, ADC 201 and digital correction module 220 generate a new output signals (e.g., digital output signal 106 and corrected ADC output signal 206) after being calibrated by capture memory module 330, and capture memory module 330 captures a portion of these new output signals. Based on this new captured data, capture memory module 330 can determine whether to perform additional calibration of ADC 201 and/or digital correction module 220. If capture memory module 330 determines that additional calibration of ADC 201 and/or digital correction module 220 should be performed, capture memory module 330 transmits another analog signal to ADC 201 and/or another digital signal to digital correction module 220 to perform further calibration. This process can repeat until capture memory module 330 determines that no additional calibration of ADC 201 or digital correction module 220 should be performed. For example, in an embodiment, based on determined gain, offset, and/or timing correction parameters, capture memory module 330 can determine that the output of ADC 201 and/or digital correction module 220 is within a predefined range of a desired value and can then determine that no additional calibration of ADC 201 or digital correction module 220 should be performed.

By providing both analog and digital calibration, systems and methods according to embodiments of the present disclosure can save power by using both ADC 201 and digital correction module 220. Additionally, more exact calibration can be achieved using both ADC 201 and digital correction module 220. For example, ADC 201 can be used for coarse calibration of system 300, and digital correction module 220 can be used for fine calibration of system 300.

As discussed above, digital correction module 220 outputs corrected ADC output signal 206. In an embodiment, digital correction module 206 continuously outputs corrected ADC output signal 206, even while system 300 is being calibrated. In another embodiment, capture memory module 330 instructs (e.g., using a control signal) digital correction module 220 to output corrected ADC output signal 206 at a certain period of time (e.g., when capture memory module 330 determines that system 300 has been sufficiently calibrated). For example, in an embodiment, based on determined gain, offset, and/or timing correction parameters, capture memory module 330 can determine that the output of ADC 201 and/or digital correction module 220 is within a predefined range of a desired value and can then instruct digital correction module 220 to output corrected ADC output signal 206.

2. Methods

Figure 4:
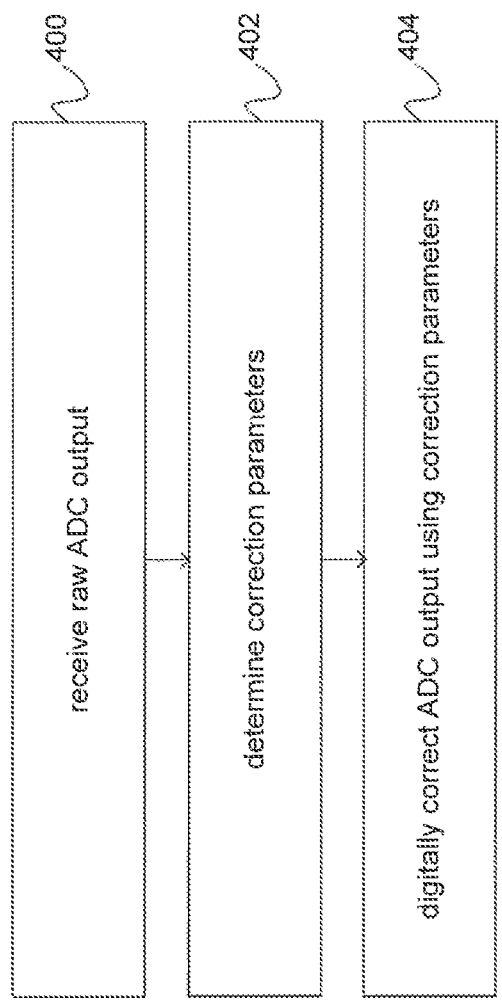
FIG. 4 is a flowchart of a method for performing ADC calibration using a digital correction module in accordance with an embodiment of the present disclosure.

FIG. 4 is a flowchart of a method for performing ADC calibration using a digital correction module in accordance with an embodiment of the present disclosure. In step 400, digital correction module 220 receives output from ADC 201. In step 402, digital correction module 220 determines correction parameters based on the output 106 from ADC 201. In step 404, digital correction module 220 digitally corrects ADC output 106 and transmits the corrected signal as corrected ADC output 206. In an embodiment, steps 400-404 can be repeated until ADC output 106 is within a predetermined range of a desired value.

Figure 5:
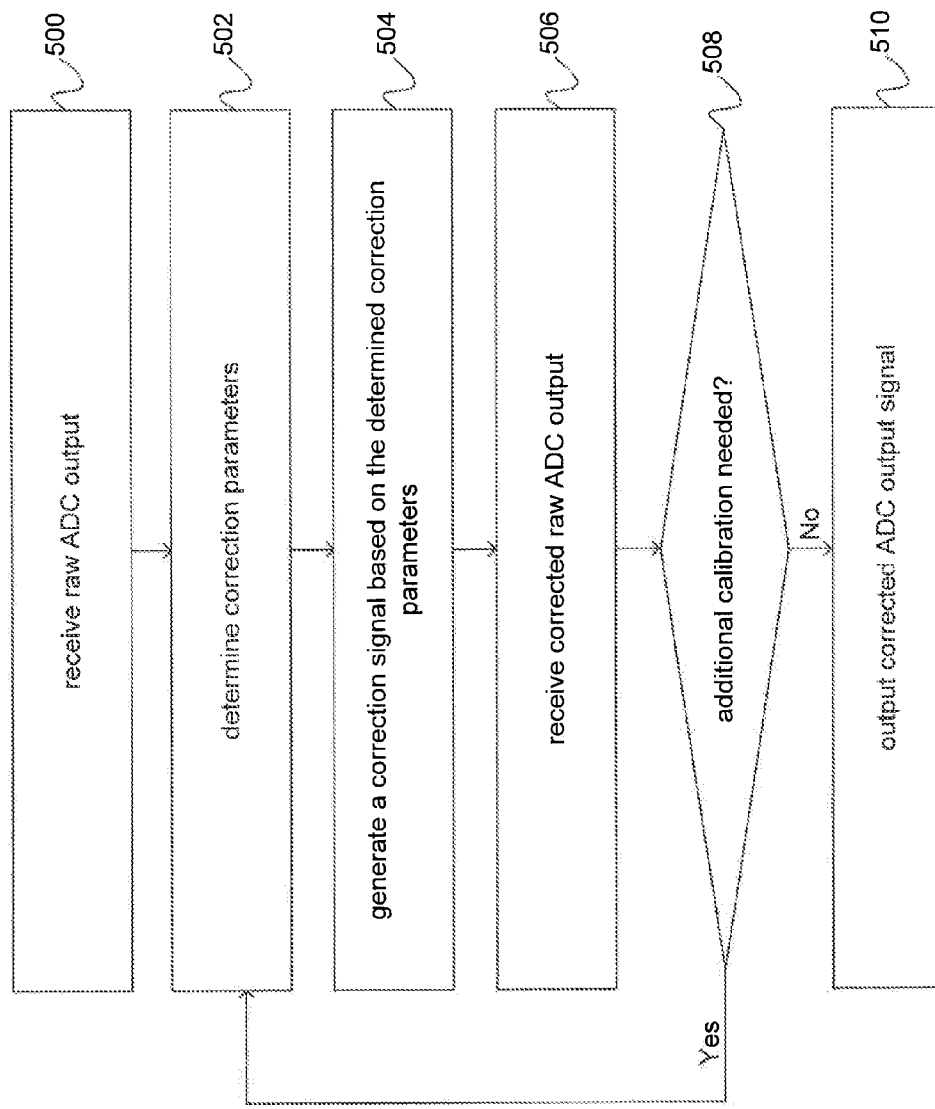
FIG. 5 is another flowchart of a method for performing ADC calibration using a digital correction module in accordance with an embodiment of the present disclosure.

FIG. 5 is another flowchart of a method for performing ADC calibration using a digital correction module in accordance with an embodiment of the present disclosure. In step 500, digital correction module 220 receives output from ADC 201. In step 502, digital correction module 220 determines correction parameters based on output 106 from ADC 201. In step 504, digital correction module 220 transmits a correction signal 204 to ADC 201 to calibrate ADC 201. In step 506, digital correction module 220 receives an updated ADC output signal 106 from ADC 201 after ADC 201 has been calibrated.

In step 508, digital correction module 220 determines whether the corrected raw ADC output 106 received at step 506 is within a predetermined range of a desired value. If the corrected raw ADC output 106 received at step 506 is not within a predetermined range of a desired value, the method proceeds to step 502. If the corrected raw ADC output 106 is within the predetermined range of the desired value, the method proceeds to step 508. In step 508, the corrected ADC output signal 206 is transmitted (e.g., by digital correction module 220). In an embodiment, steps 500-508 can be repeated until the corrected raw ADC output 106 received at step 506 is within a predetermined range of a desired value.

Figure 6:
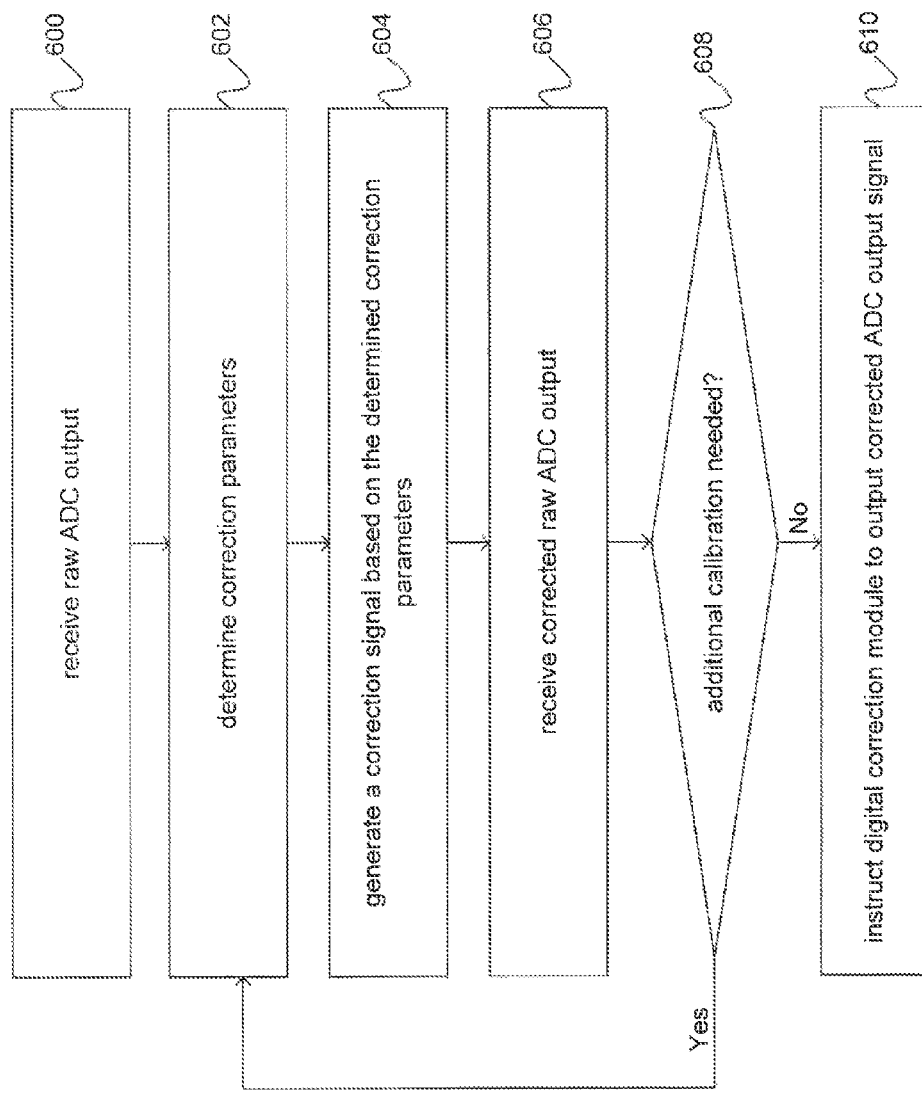
FIG. 6 is a flowchart of a method for performing ADC calibration using an ADC capture memory in accordance with an embodiment of the present disclosure.

FIG. 6 is a flowchart of a method for performing ADC calibration using an ADC capture memory in accordance with an embodiment of the present disclosure. In step 600, capture memory module 330 receives output from ADC 201. In step 602, using microprocessor 340, capture memory module 330 determines correction parameters based on output from ADC 201. In step 604, using microprocessor 340, capture memory module 330 transmits an analog (or digital) correction signal to ADC 201 to calibrate ADC 201. In step 606, capture memory module 330 receives an updated ADC output signal from ADC 201 after ADC 201 has been calibrated.

In step 608, using microprocessor 340, capture memory module 330 determines whether the corrected raw ADC output received at step 606 is within a predetermined range of a desired value. If the corrected raw ADC output at step 606 is not within a predetermined range of a desired value, the method proceeds to step 602. If the corrected raw ADC output is within the predetermined range of the desired value, the method proceeds to step 610. In step 610, using microprocessor 340, capture memory module 330 instructs digital correction module 220 to transmit corrected ADC output signal 206. In an embodiment, steps 600-608 can be repeated until the corrected raw ADC output received at step 606 is within a predetermined range of a desired value.

Figure 7:
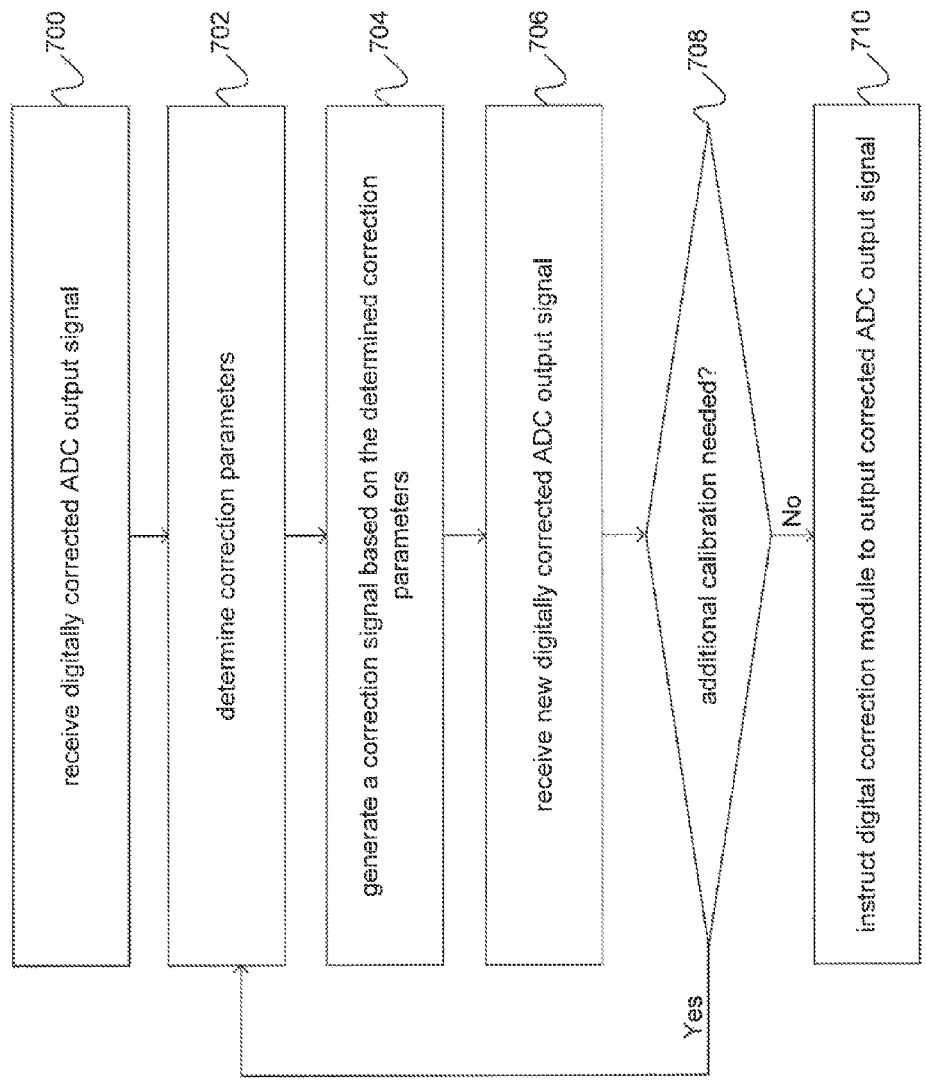
FIG. 7 is another flowchart of a method for performing ADC calibration using an ADC capture memory by calibrating a digital correction module in accordance with an embodiment of the present disclosure.

FIG. 7 is another flowchart of a method for performing ADC calibration using an ADC capture memory by calibrating a digital correction module in accordance with an embodiment of the present disclosure. In step 700, capture memory module 330 receives output from digital correction module 220. In step 702, using microprocessor 340, capture memory module 330 determines correction parameters based on output from digital correction module 220. In step 704, using microprocessor 340, capture memory module 330 transmits a digital correction signal to digital correction module 220 to calibrate digital correction module 220. In step 706, capture memory module 330 receives an updated output signal from digital correction module 220 after digital correction module 220 has been calibrated.

In an embodiment, steps 700-708 can be repeated until the new digitally corrected ADC output signal received at step 706 is within a predetermined range of a desired value. For example, in step 708, using microprocessor 340, capture memory module 330 determines whether the new digitally corrected ADC output signal received at step 706 is within a predetermined range of a desired value. If the new digitally corrected ADC output signal is not within a predetermined range of a desired value, the method proceeds to step 702. If the new digitally corrected ADC output signal is within the predetermined range of the desired value, the method proceeds to step 710. In step 710, using microprocessor 340, capture memory module 330 instructs digital correction module 220 to transmit corrected ADC output signal 206.

Figure 8:
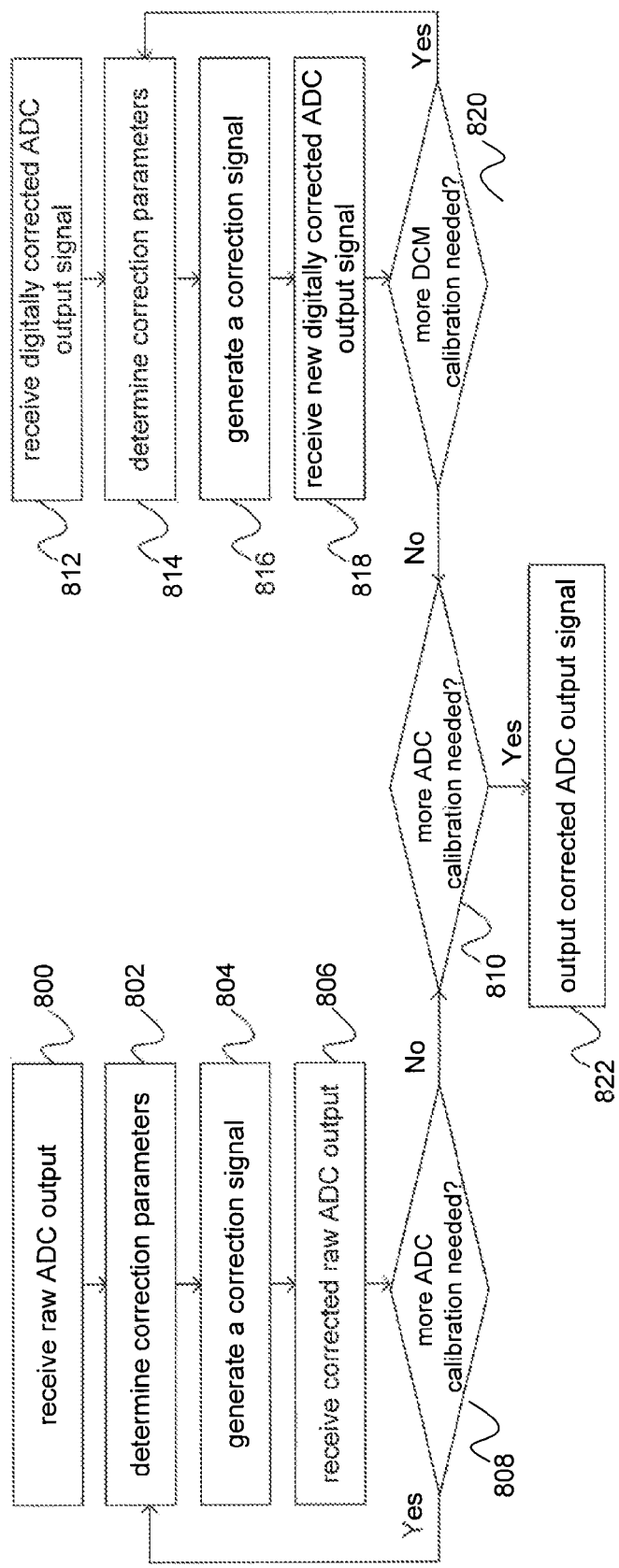
FIG. 8 is another flowchart of a method for performing ADC calibration using an ADC capture memory by calibrating an ADC and a digital correction module in accordance with an embodiment of the present disclosure.

FIG. 8 is another flowchart of a method for performing ADC calibration using an ADC capture memory by calibrating an ADC and a digital correction module in accordance with an embodiment of the present disclosure. In step 800, capture memory module 330 receives output from ADC 201.

In step 802, using microprocessor 340, capture memory module 330 determines correction parameters based on output from ADC 201. In step 804, using microprocessor 340, capture memory module 330 transmits an analog (or digital) correction signal to ADC 201 to calibrate ADC 201. In step 806, capture memory module 330 receives an updated ADC output signal from ADC 201 after ADC 201 has been calibrated.

In an embodiment, steps 800-808 can be repeated until the corrected raw ADC output received at step 806 is within a predetermined range of a desired value. For example, in step 808, using microprocessor 340, capture memory module 330 determines whether the corrected raw ADC output received at step 806 is within a predetermined range of a desired value. If the corrected raw ADC output received at step 806 is not within a predetermined range of a desired value, the method proceeds to step 802. If the corrected raw ADC output is within the predetermined range of the desired value, the method proceeds to step 810. In step 810, using microprocessor 340, capture memory module 330 determines whether additional digital calibration should be performed using digital correction module 220. If capture memory module 330 determines that additional digital calibration should be performed, capture memory module 330 can wait until this digital calibration is performed before instructing digital correction module 220 to generate corrected ADC output signal 206.

In an embodiment, steps 812-820 are performed while steps 800-808 are performed. However, it should be understood that steps 800-808 can be performed before steps 812-820 and that steps 812-820 can be performed before steps 800-808. In step 812, capture memory module 330 receives output from digital correction module 220. In step 814, using microprocessor 340, capture memory module 330 determines correction parameters based on output from digital correction module 220. In step 816, using microprocessor 340, capture memory module 330 transmits a digital correction signal to digital correction module 220 to calibrate digital correction module 220. In step 818, capture memory module 330 receives an updated output signal from digital correction module 220 after digital correction module 220 has been calibrated.

In an embodiment, steps 812-820 can be repeated until the new digitally corrected ADC output signal received at step 818 is within a predetermined range of a desired value. For example, in step 820, using microprocessor 340, capture memory module 330 determines whether the new digitally corrected ADC output signal received at step 818 is within a predetermined range of a desired value. If the new digitally corrected ADC output signal is not within a predetermined range of a desired value, the method proceeds to step 814. If the new digitally corrected ADC output signal is within the predetermined range of the desired value, the method proceeds to step 810. In step 810, using microprocessor 340, capture memory module 330 determines whether additional analog calibration should be performed using ADC 201. If capture memory module 330 determines that additional analog calibration should be performed, capture memory module 330 can wait until this analog calibration is performed before instructing digital correction module 220 to generate corrected ADC output signal 206.

Once ADC and DCM calibration has been completed, the method proceeds to step 822. In step 822, using microprocessor 340, capture memory module 330 instructs digital correction module 220 to transmit corrected ADC output signal 206.

3. Advantages

Systems and methods provided by embodiments of the present disclosure have several advantages. For example, systems and methods according to embodiments of the present disclosure using an ADC capture technique are not limited to specific applications and do not need to make assumptions about the input signal. Using microprocessor 340, capture memory module 330 can look at the signal characteristics and can determine which calibration scheme (of several possible calibration schemes) is appropriate. Additionally, microprocessor 340 can also measure the bit error rate and determine the effect that changing parameters has on the bit error rate. For example, microprocessor 340 can adjust parameters to minimize the bit error rate. Further, microprocessor 340 and capture memory module 330 provide the ability to correct for bandwidth mismatch and/or non-linearites among sub-modules 104.

Systems and methods according to embodiments of the present disclosure can use the same hardware architecture to implement several different algorithms to estimate gain, offset, and/or timing-skew error. Microprocessor 340 can dynamically select which of several algorithms to use depending on the measured signal characteristics. Other techniques select a single algorithm. In this case, ADC calibration is suboptimum if the actual input signal characteristics are different from what is assumed by the algorithm.

Additionally, implementing multiple algorithms using microprocessor 340 is inexpensive because no additional hardware is necessary. Microprocessor 340 can use information from other portions of the system (e.g. bit-error statistics from an error-correction block, slicer error, etc.) that are not normally used for ADC calibration because of the complex relationship between these statistics and ADC parameters. Microprocessor 340 can model the effects of a parameter change using the captured data (i.e. gain, offset, and/or timing adjustment change) before sending the parameters to the analog/digital correction hardware. This allows microprocessor 340 to eliminate the dithering effects that can be present in other implementations in which the hardware: (1) adjusts a setting; (2) observes the effect of the setting; and (3) decides whether to increase or decrease the setting in subsequent iterations.

4. Conclusion

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, and further the invention should be defined only in accordance with the following claims and their equivalents.

What is claimed is:

1. A system, comprising:
   an analog to digital converter (ADC);
   a digital correction module coupled to the ADC;
   a capture memory module, coupled to the ADC and the digital correction module, configured to:

initiate an adjustment of a first parameter of the ADC, and initiate an adjustment of a second parameter of the digital correction module; and a processor coupled to the capture memory.

2. The system of claim 1, wherein the ADC is an interleaved ADC.

3. The system of claim 2, wherein the ADC is a time-interleaved ADC.

4. The system of claim 2, wherein the digital correction module is configured to:

receive an output signal from the ADC;

digitally correct the output signal; and output a digitally corrected output signal.

5. The system of claim 4, wherein the ADC further comprises:

a plurality of sub-modules; and a plurality of sample-and-hold modules, wherein respective sample-and-hold modules in the plurality of sample-and-hold modules are coupled to respective sub-modules in the plurality of sub-modules.

6. The system of claim 1, wherein the capture memory module is configured to:

receive an output generated by the ADC;

determine correction parameters based on the ADC output;

generate a correction signal based on the correction parameters; and receive a corrected output generated by the ADC.

7. The system of claim 6, wherein the capture memory module is further configured to:

determine, based on the corrected output, whether additional ADC calibration should be performed.

8. The system of claim 7, wherein the capture memory module is further configured to:

initiate, using the processor, additional ADC calibration in response to determining that additional ADC calibration should be performed; and initiate a generation of a digitally corrected signal in response to determining that no additional ADC calibration should be performed.

9. The system of claim 7, wherein the capture memory module is further configured to:

determine whether additional digital correction module calibration should be performed;

wait for additional digital correction module calibration to be performed in response to determining that additional digital correction module calibration should be performed; and initiate a generation of a digitally corrected signal in response to determining that no additional ADC calibration or digital correction module calibration should be performed.

10. The system of claim 1, wherein the capture memory module is configured to:

receive a digital correction module output generated by the digital correction module;

determine correction parameters based on the digital correction module output;

generate a correction signal based on the correction parameters; and receive a corrected digital correction module output generated by the digital correction module.

11. The system of claim 10, wherein the capture memory module is further configured to:

determine, based on the corrected digital correction module output, whether additional digital correction module calibration should be performed.

12. The system of claim 11, wherein the capture memory module is further configured to:

initiate, using the processor, additional digital correction module calibration in response to determining that additional digital correction module calibration should be performed; and initiate a generation of a digitally corrected signal in response to determining that no additional digital correction module calibration should be performed.

13. The system of claim 10, wherein the capture memory module is further configured to:

determine whether additional ADC calibration should be performed;

wait for additional ADC calibration to be performed in response to determining that additional ADC calibration should be performed; and initiate a generation of a digitally corrected signal in response to determining that no additional ADC calibration or digital correction module calibration should be performed.

14. A system, comprising:

an analog to digital converter (ADC); and a capture memory module, coupled to the ADC and to a processor, wherein the capture memory module is configured to:

receive an ADC output generated by the ADC;

determine a correction parameter based on the ADC output;

send a correction signal based on the correction parameter to the ADC; and receive a corrected ADC output generated by the ADC based on the correction signal.

15. The system of claim 14, wherein the capture memory module is further configured to:

determine, based on the corrected ADC output, whether additional analog calibration should be performed.

16. The system of claim 15, wherein the capture memory module is further configured to:

perform additional analog calibration in response to determining that additional analog calibration should be performed; and initiate a generation of a digitally corrected signal in response to determining that no additional analog calibration should be performed.

17. The system of claim 15, wherein the capture memory module is further configured to:

determine whether additional digital calibration should be performed;

wait for additional digital calibration to be performed in response to determining that additional digital calibration should be performed; and initiate a generation of a digitally corrected signal in response to determining that no additional analog calibration or digital calibration should be performed.

18. A method, comprising:

receiving an analog to digital converter (ADC) output generated by an ADC;

determining, using a processing device, a correction parameter based on the ADC output;

sending, using the processing device, a correction signal based on the correction parameter to the ADC; and receiving a corrected ADC output generated by the ADC based on the correction signal.

19. The method of claim 18, further comprising:

receiving a digital correction module output generated by a digital correction module;

determining the correction parameter based on the digital correction module output;

sending a second correction signal based on the correction barometer to the digital correction module; and receiving a corrected digital correction module output generated by the digital correction module based on the second correction signal.

20. The method of claim 19, further comprising:

determining whether additional digital calibration should be performed;

waiting for additional digital calibration to be performed in response to determining that additional digital calibration should be performed;

determining whether additional analog calibration should be performed;

waiting for additional analog calibration to be performed in response to determining that additional analog calibration should be performed; and initiating a generation of a digitally corrected signal in response to determining that no additional analog calibration or digital calibration should be performed.

* * * * *